(12) United States Patent
Ekhoff

(10) Patent No.: US 10,293,443 B1
(45) Date of Patent: May 21, 2019

(54) PRECISION PNEUMATIC DRILLING SPINDLE AND METHOD

(71) Applicant: Donald L. Ekhoff, Morgan Hill, CA (US)

(72) Inventor: Donald L. Ekhoff, Morgan Hill, CA (US)

( * ) Notice: Subject to any disclaimer, the term of this patent is extended or adjusted under 35 U.S.C. 154(b) by 8 days.

(21) Appl. No.: 15/638,297

(22) Filed: Jun. 29, 2017

Related U.S. Application Data

(60) Provisional application No. 62/356,219, filed on Jun. 29, 2016.

(51) Int. Cl.
| | | |
|---|---|---|
| *B23Q 5/06* | (2006.01) | |
| *B23Q 11/00* | (2006.01) | |
| *B23B 41/14* | (2006.01) | |
| *H05K 3/00* | (2006.01) | |
| *H01L 21/48* | (2006.01) | |
| *H01L 21/66* | (2006.01) | |

(52) U.S. Cl.
CPC ............ *B23Q 5/06* (2013.01); *B23B 41/14* (2013.01); *B23Q 11/005* (2013.01); *H05K 3/0047* (2013.01); *H05K 3/0055* (2013.01); *B23B 2228/36* (2013.01); *B23B 2250/12* (2013.01); *B23B 2270/027* (2013.01); *B23B 2270/30* (2013.01); *H01L 21/486* (2013.01); *H01L 21/4864* (2013.01); *H01L 22/12* (2013.01); *H05K 2203/163* (2013.01)

(58) Field of Classification Search
CPC ..................................... B23Q 5/06; B23Q 5/08
USPC ........................... 408/702; 173/218; 415/202
See application file for complete search history.

(56) References Cited

U.S. PATENT DOCUMENTS

| | | | | |
|---|---|---|---|---|
| 3,124,979 A | * | 3/1964 | Macks ...................... | B23Q 1/38 |
| | | | | 173/148 |
| 3,306,375 A | * | 2/1967 | Macks ...................... | A61C 1/05 |
| | | | | 173/218 |
| 3,383,805 A | * | 5/1968 | Powell ...................... | A61C 1/05 |
| | | | | 415/80 |
| 3,677,351 A | * | 7/1972 | Geissler .................. | B23B 45/04 |
| | | | | 173/168 |

(Continued)

FOREIGN PATENT DOCUMENTS

| | | | | | |
|---|---|---|---|---|---|
| JP | | 62208843 A | * | 9/1987 | ............. B23Q 5/043 |
| WO | WO 2011001421 A1 | * | 1/2011 | ............... B23Q 5/06 |

*Primary Examiner* — Daniel W Howell
(74) *Attorney, Agent, or Firm* — Mitch Harris, Atty at Law, LLC; Andrew M. Harris

(57) ABSTRACT

A precision pneumatic drill spindle and method provides reduced spin axis error and increased rate of forming holes in a microelectronic substrate. The spindle includes a press-fit collar that accepts drill bits and incorporates turbine blades around the collar, which is rotated by directing pressurized air through a number of nozzles distributed around the collar within a housing of the spindle. The collar is supported by air bearings above and below the collar. The turbine blades may be provided by concavities in the collar forming a Pelton wheel type rotation system that concentrates the air flow to improve energy transfer from the pressurized air directed by the nozzles to the collar, increasing the rotation rate of the collar. Exit air may be directed downward toward the tip of the drill bit by inclined channels within the lower air bushing assembly, improving the debris removal rate.

18 Claims, 14 Drawing Sheets

(56) References Cited

U.S. PATENT DOCUMENTS

| | | | | |
|---|---|---|---|---|
| 5,020,968 | A * | 6/1991 | Yamada | ............... B23Q 17/10 318/400.22 |
| 6,840,723 | B2 * | 1/2005 | Jacobsson | ............... B23Q 5/06 408/124 |
| 8,070,400 | B2 * | 12/2011 | Busatta | ............... B23B 31/117 408/130 |
| 2009/0252594 | A1 * | 10/2009 | Itoh | ............... F01D 15/065 415/110 |
| 2016/0008937 | A1 * | 1/2016 | Sanders | ............... B23Q 5/06 415/208.1 |

\* cited by examiner

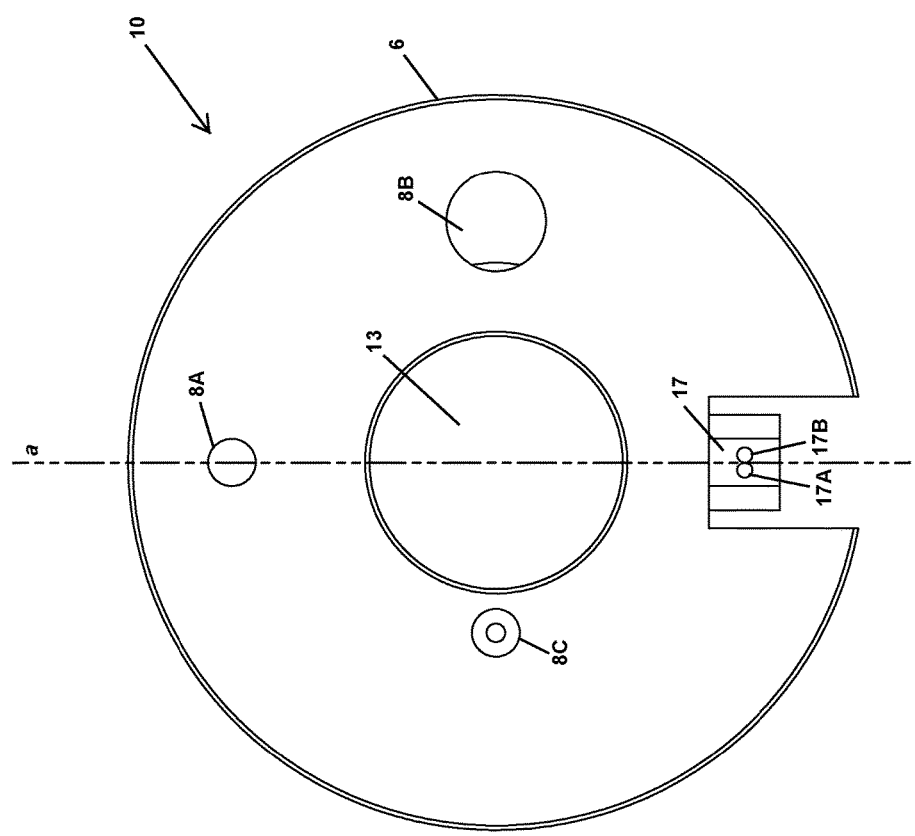

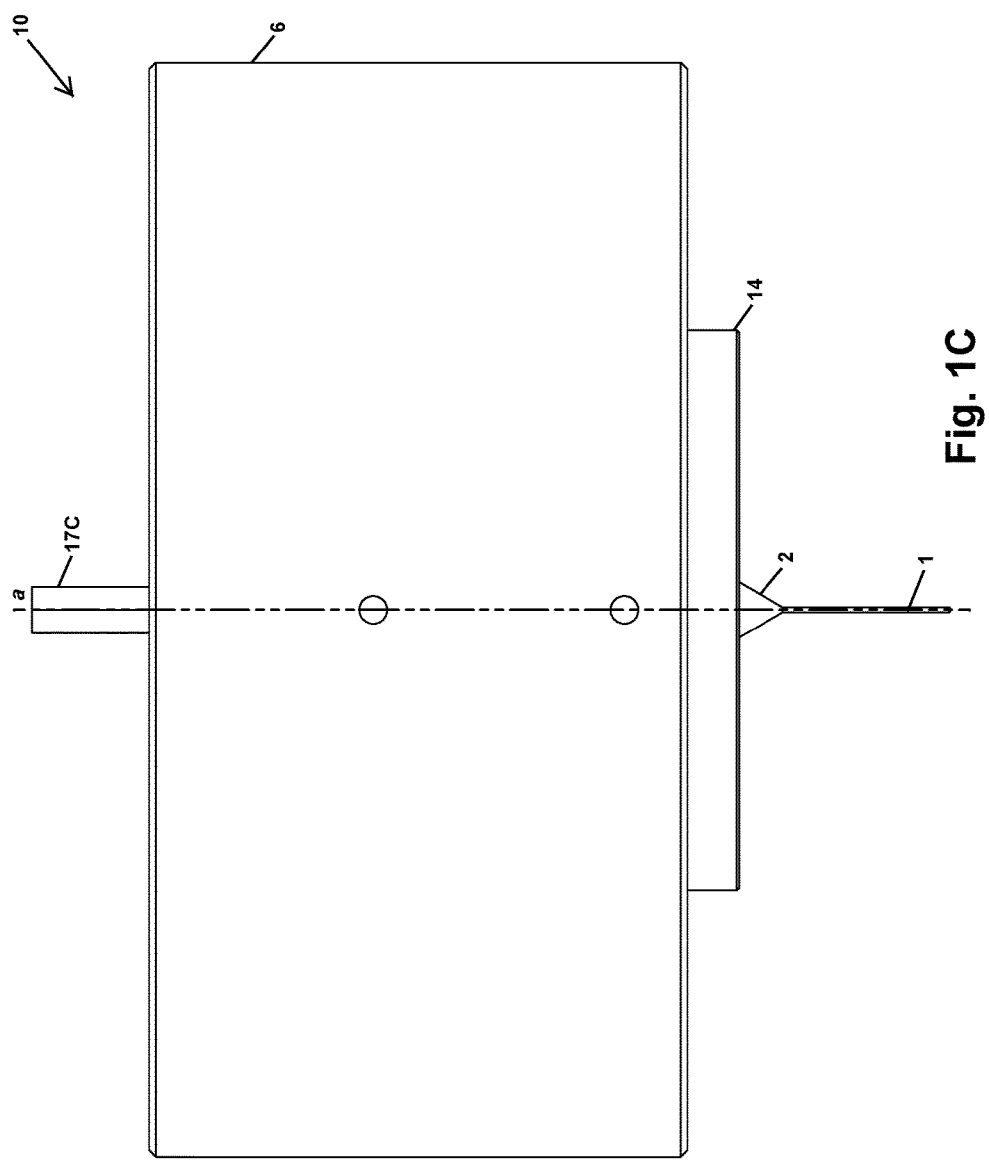

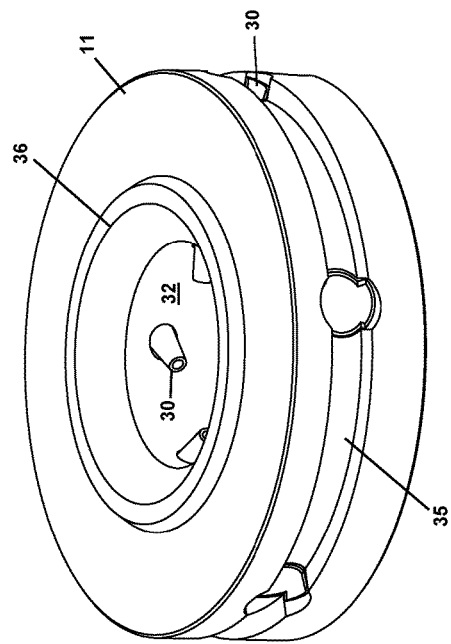
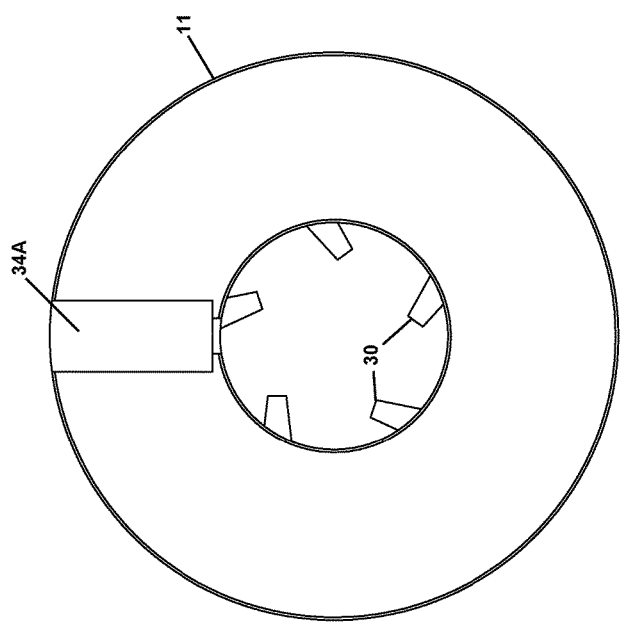
Fig. 3C
Fig. 3B

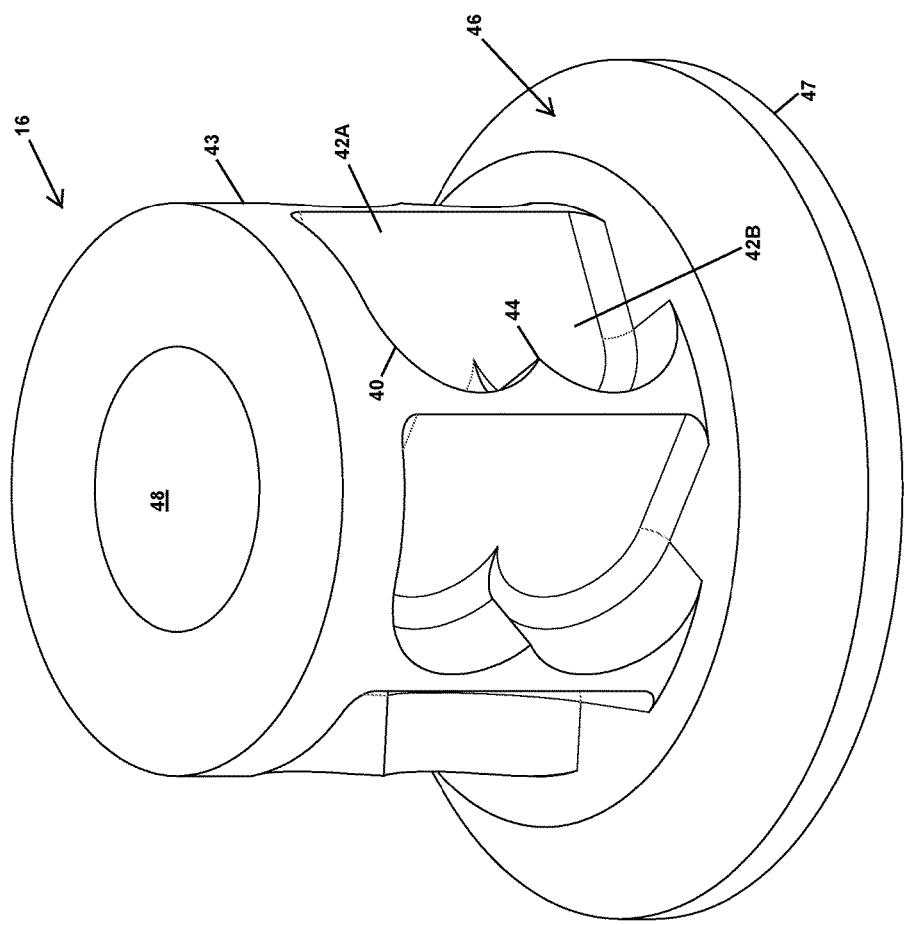

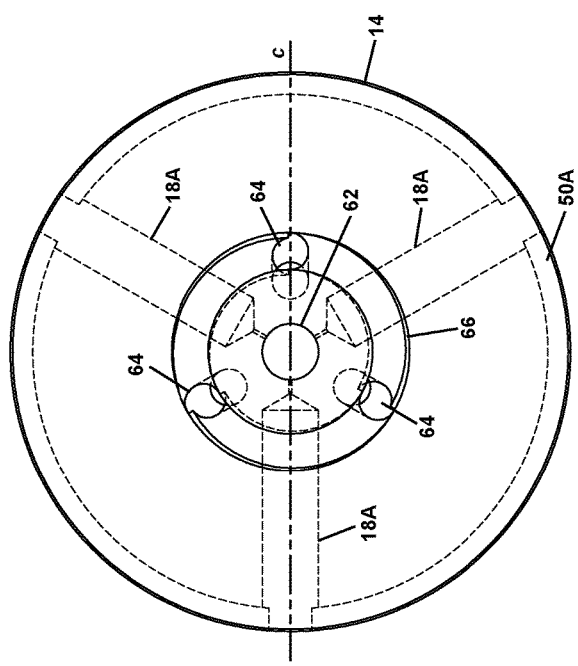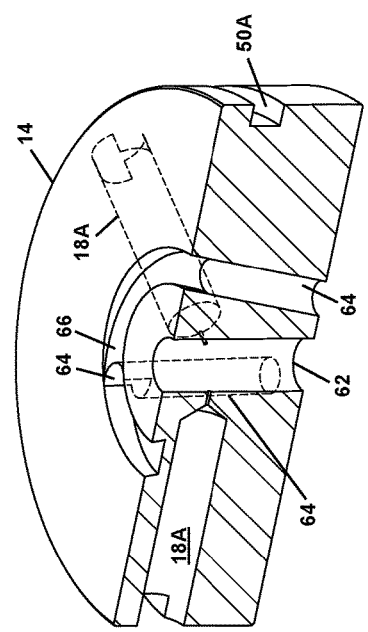

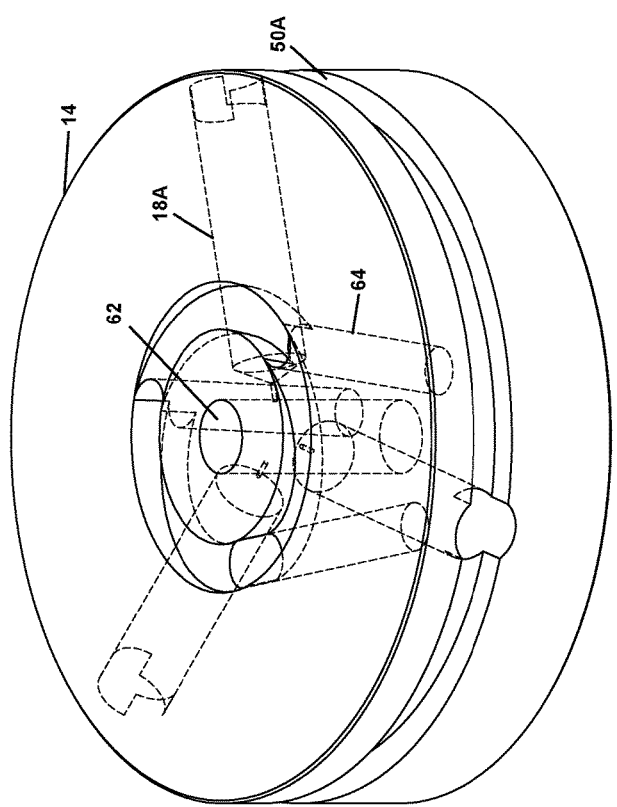
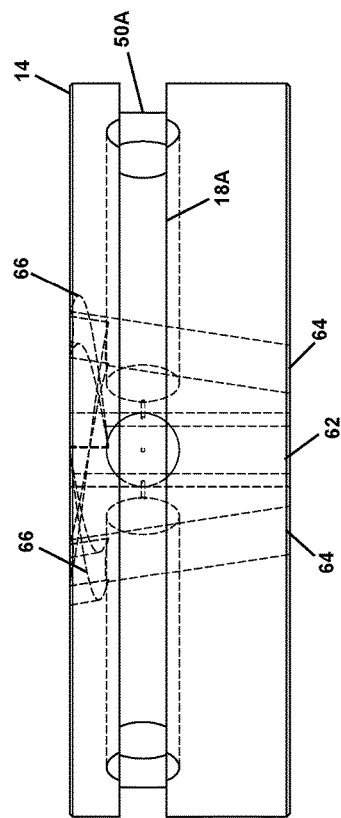
Fig. 6C
Fig. 6D

PRECISION PNEUMATIC DRILLING SPINDLE AND METHOD

This U.S. Patent Application claims priority under 35 U.S.C. § 119(e) to U.S. Provisional Patent Application Ser. No. 62/356,219 filed on Jun. 29, 2016.

BACKGROUND OF THE INVENTION

1. Field of the Invention

The present invention relates generally to drill heads for fabricating via and other holes in electronic circuit substrates.

2. Description of the Related Art

Multi-layer printed wiring boards (PWBs), stacked microelectronic substrates, polyimide circuit mounting films and other precision pack mounting structures require drilling for plated-through holes and vias (including silicon vias) that produces uniform and precisely located drill holes. Precision small holes are also needed in glass, quartz and silicon interposers and substrates. Typical drill processes for forming such holes incorporate movable electric drill heads and/or movable platens that align and rotate a drill bit to machine the holes. As the size of the structures being formed has shrunk, increased drill spindle rotational rates are needed in order to effectively remove material from the holes, as the rate of removal of drilling debris is proportionate to the spindle rotation rate.

The typical drill heads employed in substrate fabrication use a motor coupled to a collet gripper or "chuck" that secures a standardized ⅛" or 3 mm diameter shank having a solid carbide tip having a diameter only a fraction of a millimeter (e.g., 0.5 mm down to 0.001 in). Drill spin axis errors due to tolerances of the collet and alignment of the bit within the collet cause the drill points to fail as they wobble while engaged with a hole being drilled. An upper limit of approximately 200,000 revolutions-per-minute (RPM) can be achieved with such an apparatus, limiting both the fabrication rate and the material removal rate.

Therefore, it would be desirable to provide a precision drill spindle having reduced drill spin axis errors and increased rotation rate.

SUMMARY OF THE INVENTION

The objectives of reducing drill spin axis errors while improving spindle rotation rate are provided in a precision pneumatic drill spindle.

The precision pneumatic drill spindle includes a housing with an inlet disposed on an exterior surface for receiving a source of pressurized gas, a collar within the housing and having a plurality of turbine blades formed therein. A hole is formed through the collar for accepting a shank of a drill bit. The precision pneumatic drill spindle also includes a plurality of nozzles within the housing and in fluid communication with the inlet to receive the pressurized gas and for constricting the flow of the pressurized gas to a corresponding plurality of outlets directed at the turbine blades of the collar to cause rotation of the collar. The collar is supported by a first air bushing within the housing for supporting an upper end of the shank opposite a tip of the drill bit and a second air bushing at a lower end of the housing for supporting a lower portion of the shank below the collar.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof will best be understood by reference to the following detailed description of an illustrative embodiment when read in conjunction with the accompanying drawings, wherein like reference numerals indicate like components, and:

FIG. 1B is a top view, and FIG. 1C is a side view, showing an example of a precision pneumatic drill spindle 10 as disclosed herein.

FIG. 3B is a top view, and FIG. 3C is a bottom perspective view, showing details of a nozzle assembly 11 of precision pneumatic drill spindle 10 of FIGS. 1A-1C.

FIG. 4A is a perspective view and FIG. 4B is a side view of a collar 16 of precision pneumatic drill spindle 10 of FIGS. 1A-1C.

FIG. 6A is a top view, FIG. 6B is a perspective cross-section view, FIG. 6C is a top perspective view and FIG. 6D is a side view, showing details of a lower air bushing 14 of precision pneumatic drill spindle 10 of FIGS. 1A-1C.

DESCRIPTION OF ILLUSTRATIVE EMBODIMENT

The present invention includes precision pneumatic drill spindles and methods that reduce drill spin axis errors (wobble) and increase rotation rate and debris removal in drilling of PCB substrates and other electronic interconnects, as well as interposers and insulators as mentioned above. The precision pneumatic drill spindles use a collar that incorporates turbine blades that are spun by pressurized gas directed at nozzles disposed around the collar. The collar accepts a drill bit by press-fitting the drill bit through a hole in the collar. The collar is supported during operation by air bushings. An automatic bit change operation is provided by securing the bottommost air bushing to the spindle with a vacuum. Multiple collar/bit/lower air bushing assemblies can be interchanged remotely by releasing the vacuum to drop the currently installed assembly and activating the vacuum to pick up a new assembly.

Figure 1A:
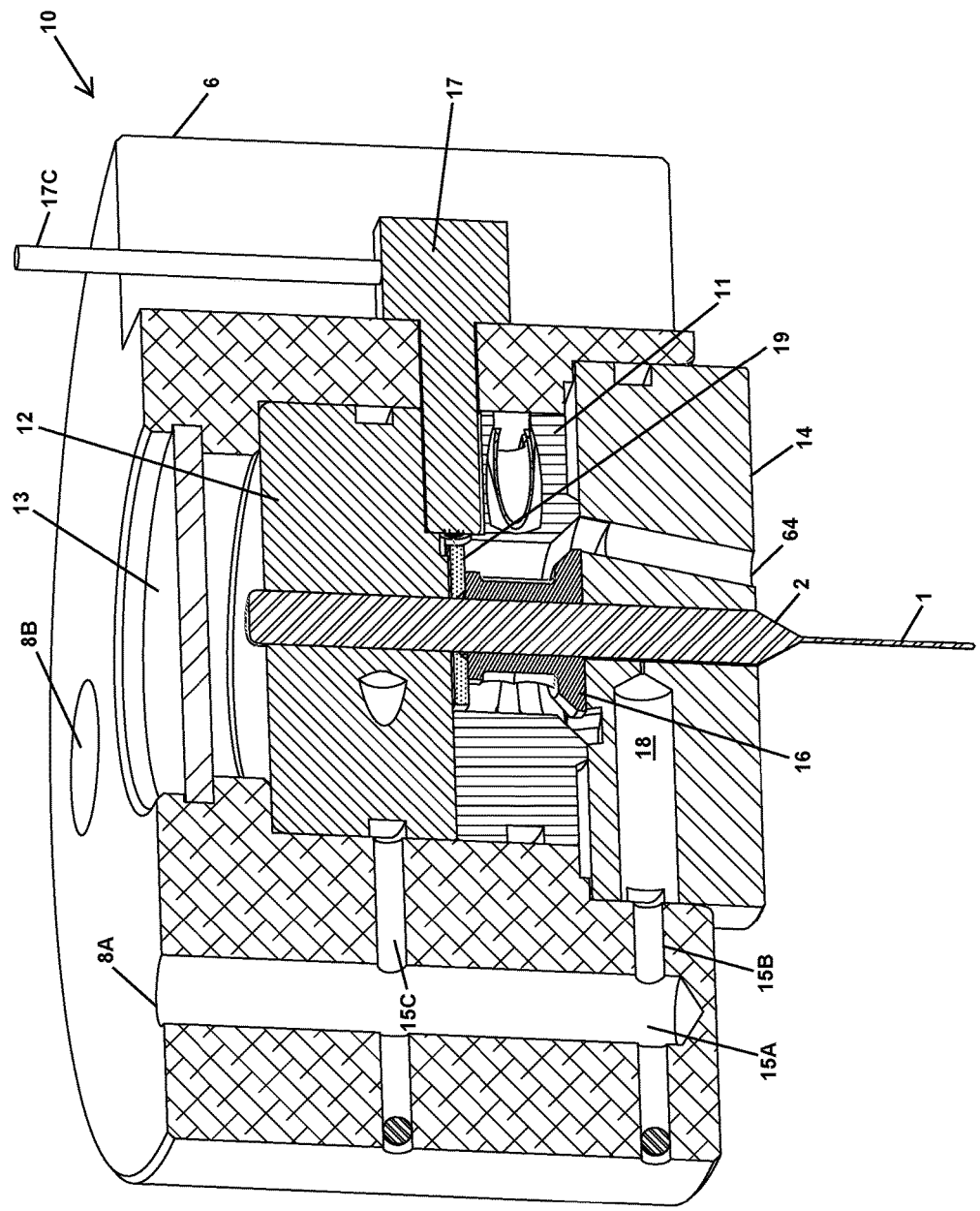
FIG. 1A is a perspective cross section view.

Referring now to FIG. 1A, an illustrative example of a precision pneumatic drill spindle 10 is shown in a cross-section view. Precision pneumatic drill spindle 10 includes a housing 6 in which a plurality of air channels are formed and which contains the moving parts and bearings required to support and rotate a drill bit tip 1 by a shank 2 of drill bit 1. Shank 2 generally has a standard shank diameter of 0.125 in, but may differ in size by application. Shank 2 is press-fit into a collar 16 that rotates above a lower air bushing 14, which may be made from metal or a composite material that differs from that of collar 16 to prevent friction welding as collar 16 stops rotating. Lower air bushing 14 secures the components of precision pneumatic drill spindle 10 within a void formed through the bottom of housing 6. The upper end of collar 16 contacts a thrust washer 19, also of dissimilar material, and that has an area equal to that of the bottom surface of collar 16 in order to balance the friction load at the upper and lower ends of collar 16. An upper air bushing 12 supports the upper end of shank 2 and is assembled into housing 6 by insertion through the lower void formed in housing 6. Upper air bushing 12 and lower air bushing 14 are supplied with pressurized air, or another gas, via an inlet 8A disposed on an outer surface of housing 6, and the pressurized air is directed through a channel 15A to feed a channel 15C that supplies air to upper air bushing 12 and a channel 15B that supplies air to lower air bushing 14. A plurality of nozzles 18 are formed in lower air bushing 14 and a similar plurality of nozzles (not shown) are formed in upper air bushing 12 to concentrate the flow of the pressurized air at the air-bearing surface formed by the gap between shank 2 and lower air bushing 14, and the gap between shank 2 and upper air bushing 12.

A nozzle assembly 11 surrounds collar 16 and includes a plurality of nozzles (not shown) that direct another source of pressurized air received at an inlet 8B to turbine blades formed by concavities in collar 16. A chamber formed by a central void in nozzle assembly 11, and into which the plurality of nozzles extends, forms an air vortex that produces a rate of rotation of collar 16 on the order of 200,000 rpm, and the source of pressurized air is controlled to maintain a flow rate that sustains the rate of rotation of collar 16 according to the design of the turbine blades formed in collar 16, which in the example is a critical pressure of 67 psi. An optical reflection sensor 17 detects the rotation of thrust washer 19 via a high contrast mark or marks on the edge of thrust washer 19 and includes an optical fiber cable 17C containing illumination and detection channel fiber(s) and that is connected to the drilling system to detect excessive rotation rates corresponding to a broken drill bit tip 1 and for controlling the operation of precision pneumatic drill spindle 10. A filter 13 formed from a plastic screening material provides a dust cap that prevents intrusion of dust and drilling debris, while providing venting to the internal components of precision pneumatic drill spindle 10, including air returned from internal air bearings. The drive air supplied to rotate collar 16 is discharged from a plurality of ports 64 formed in lower air bushing 14 that direct the exiting air toward drill bit tip 1 to increase the rate of debris removal from drilling operations and to cool drill bit tip 1.

Referring now to FIG. 1B and FIG. 1C, a top view and a side view, respectively, of precision pneumatic drill spindle 10 are shown, along with cutting plane a of the cross-section of FIG. 1A. A vacuum port 8C for providing vacuum to retain lower air bushing 14, collar 16 and shank 2 to precision pneumatic drill spindle 10, is provided on the outer surface of housing 6, and optical fibers 17A, 17B forming optical fiber cable 17C are illustrated extending from optical reflection sensor 17. Inlet 8B that provides drive pressure for rotating collar 16 and inlet 8A for providing air bearing pressure are shown atop housing 6.

Figure 2:
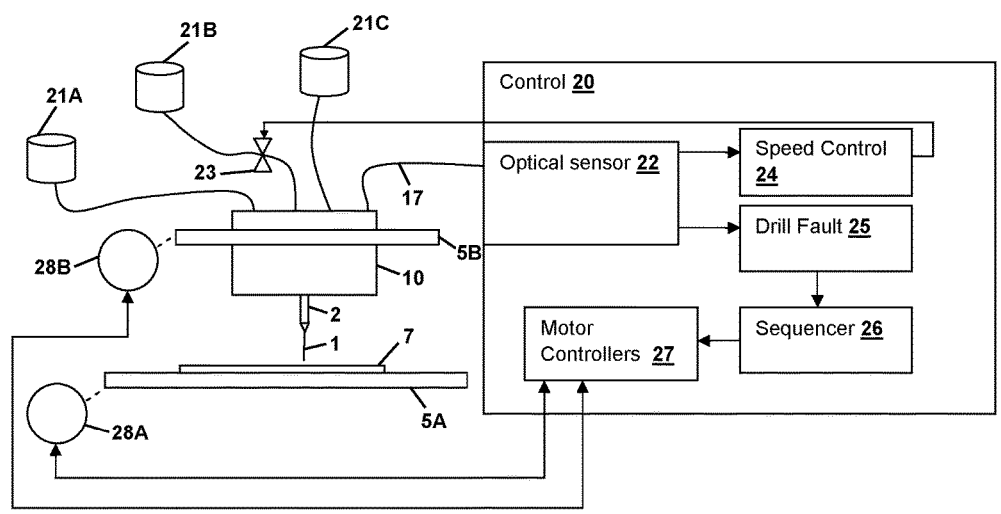
FIG. 2 is a pictorial block diagram showing an example of a drilling system incorporating precision pneumatic drill spindle 10 of FIGS. 1A-1C.

Referring now to FIG. 2, a microelectronic substrate drilling system is shown, incorporating precision pneumatic drill spindle 10. A first source of pressurized air 21B for providing drive to spin shank 2 and drill bit tip 1 is controlled with an electronic regulator 23 controlled by a speed control circuit 24 within a control unit 20 to maintain proper rotation as detected by an optical sensor unit 22 that provides illumination through and receives light reflected by the high contrast edge of thrust washer 19 via optical fiber cable 17C. A drill fault detector 25 detects when the rotation rate is sufficiently high to indicate that drill bit tip 1 is broken, or sufficiently low that there is a mechanical jam or other fault. A sequencer 26 that controls the drilling process provides input to a motor controller 27 that controls one or more positioners 28A, 28B that move one or both of a platen 5A bearing a substrate 7 to be drilled, or a drill head mount 5B, respectively. A vacuum source 21C is also provided to precision pneumatic drill spindle 10, and a second source of pressurized air 21A is provided for supplying the air bearings with pressurized air via inlet 8A (not shown). Vacuum source 21C can be controlled to interchange bit/collar/lower bushing assemblies as described above.

Figure 3A:
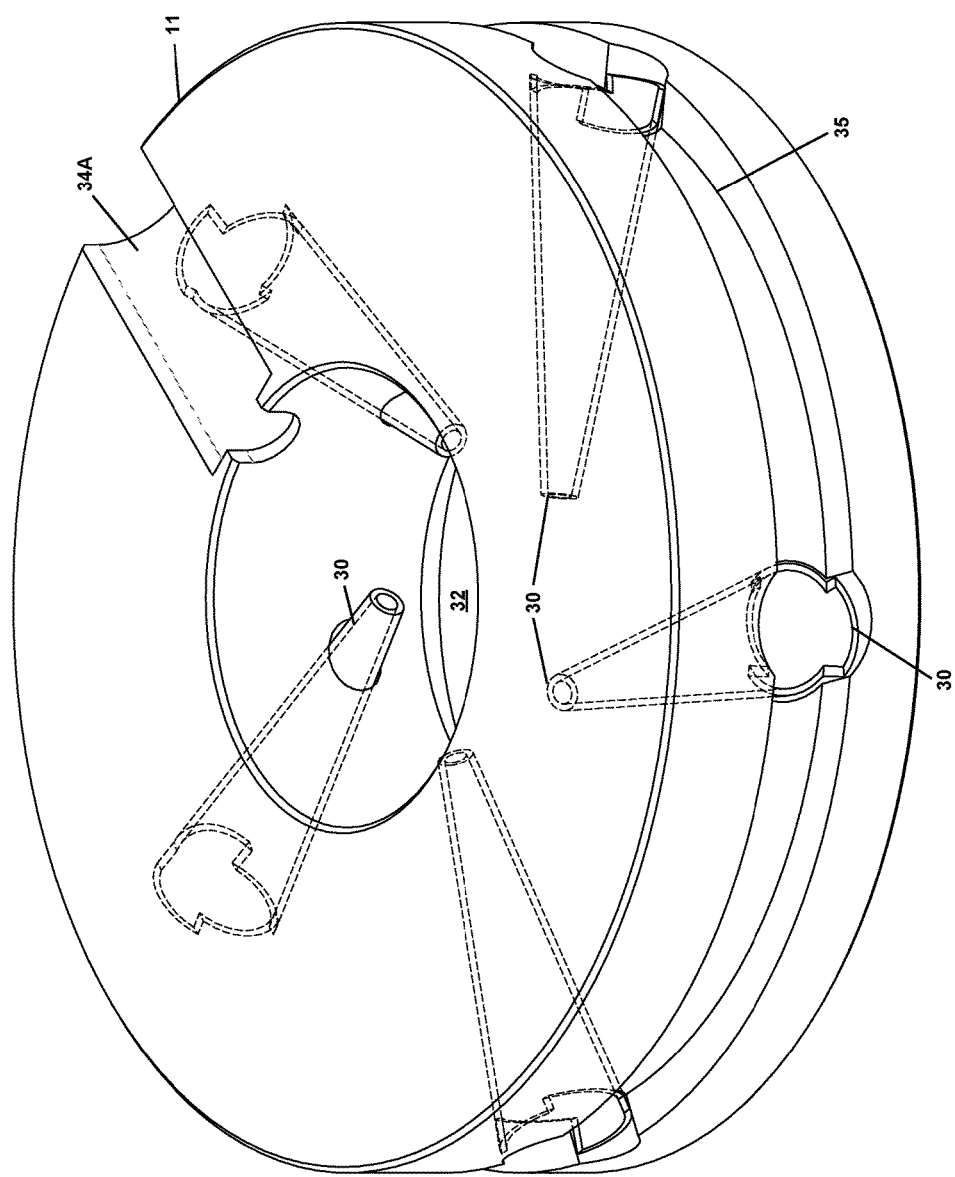
FIG. 3A is a top perspective view.

Referring now to FIGS. 3A-3C, details of nozzle assembly 11 are shown, in a top perspective view, top view and bottom perspective view, respectively. A channel 35 in the form of a ring is formed around the circumference of nozzle assembly 11, and provides a manifold for distributing the pressurized air supplied from inlet 8B in FIGS. 1A-1B to inlets of a plurality of nozzles formed by nozzle inserts 30 that extend into a chamber 32 formed by a central void in nozzle assembly 11, as mentioned above. An annular seal 36 formed on nozzle assembly 11 contacts lower air bushing 14 when lower air bushing 14 is secured by applied vacuum, as described in further detail below. The tips of nozzle inserts 30 are disposed at an angle with respect to the radial direction of the cylindrical body of nozzle assembly 11 to direct the pressurized air at the cavities formed in collar 6 (not shown) as will be illustrated below with reference to FIGS. 4A-4B. The number of nozzles 30 differs from the number of cavities in collar 6, i.e., their radial frequencies differ, to minimize torque ripple due to interaction between the lower pressure zones between the nozzles 30 in which the supplied air may not provide sufficient torque and location of the chambers provided in collar 6. A recess 34A is formed in the body of nozzle assembly 11 to permit optical reflection sensor 17 to extend through nozzle assembly 11 to reach thrust washer 19 as shown in FIG. 1A.

Figure 4B:
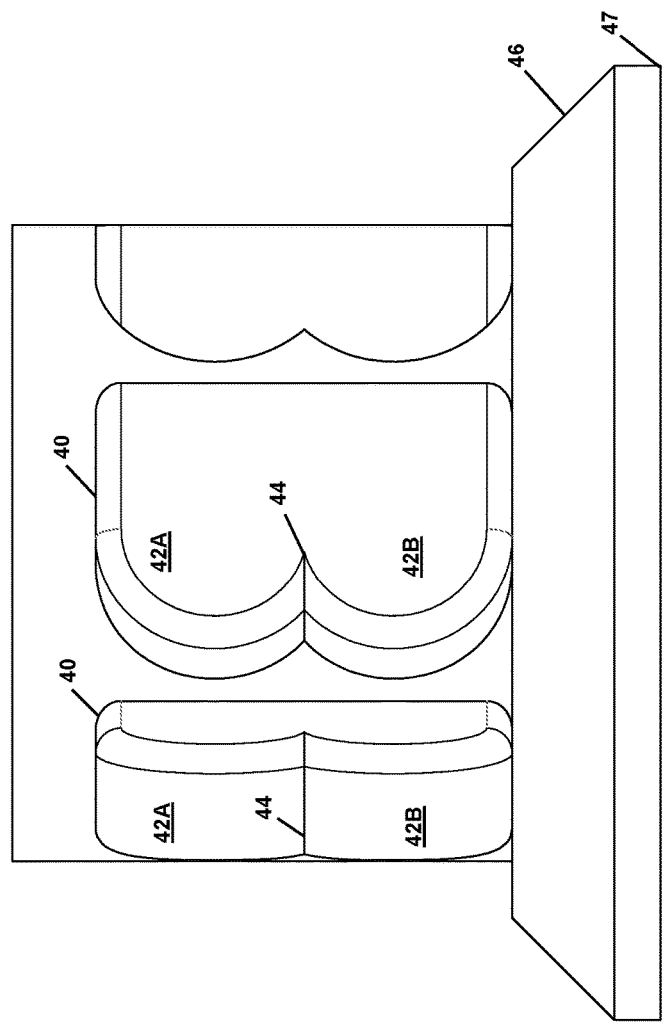

Referring now to FIGS. 4A-4B, details of collar 16 are shown, in a perspective view and side view, respectively. Cavities 40 formed in a ring-shaped portion 43 of the body of collar 16 provide turbine blades that cause collar 16 to spin, and thus shank 2 when pressed into a hole 48 through collar 16, when pressurized air is directed from the tips of nozzle inserts 30 as described above with reference to FIGS. 3A-3C. Cavities 40, in the exemplary embodiment, have a dual symmetric design about a center circumference of ring portion 43 of collar 16. Symmetric cavity portions 42A, 42B intersect to form an edge 44 at which the air stream is split into cavity portions 42A, 42B. Cavities 40 concentrate the airstream in both the circumferential direction along cavities 40 and in the axial direction parallel to the axis of ring portion 43 to increase the velocity of the air stream rebounding from the inner surface of cavities 40, resulting in a greater energy transfer to collar 16 in accordance with the principle of operation of a Pelton wheel. Collar 16 also has a conical portion 46 and a base portion 47 having a greater diameter than that of ring portion 43 to form the bottom of chamber 32 formed around collar 16 in the center of nozzle assembly 11.

Figure 5A:
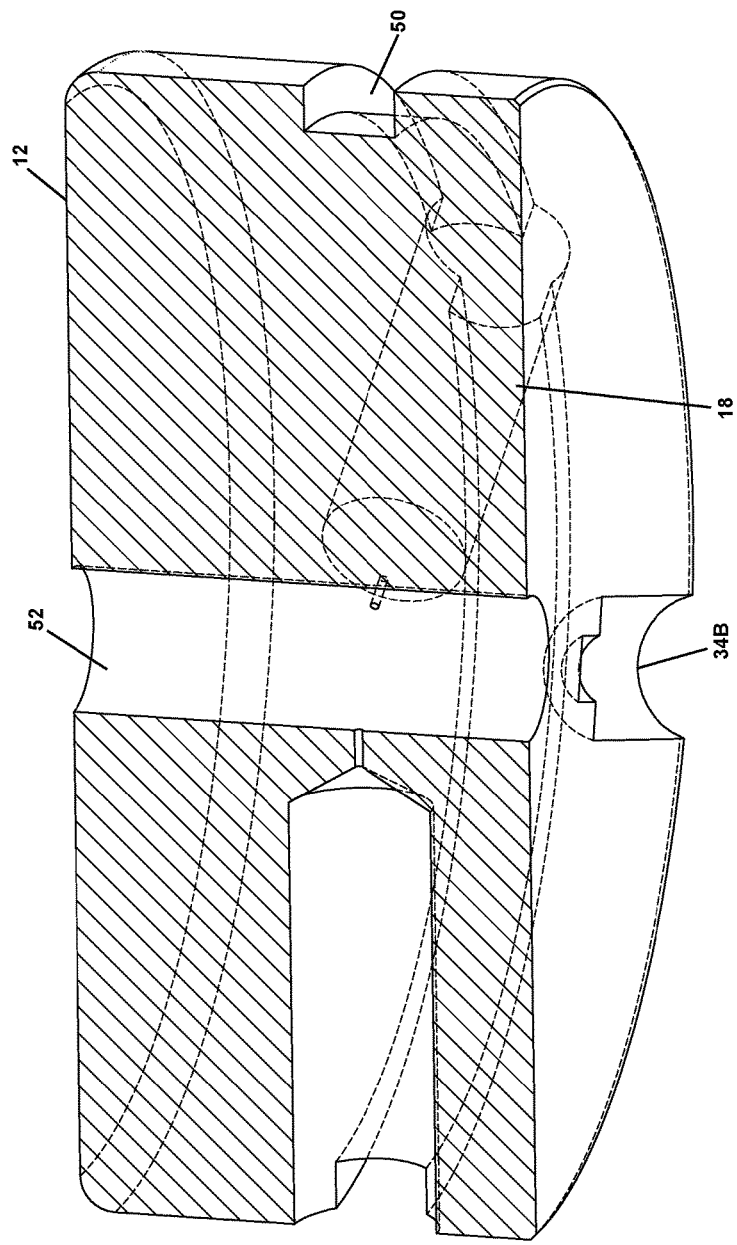
FIG. 5A is a perspective cross-section view.
Figure 5C:
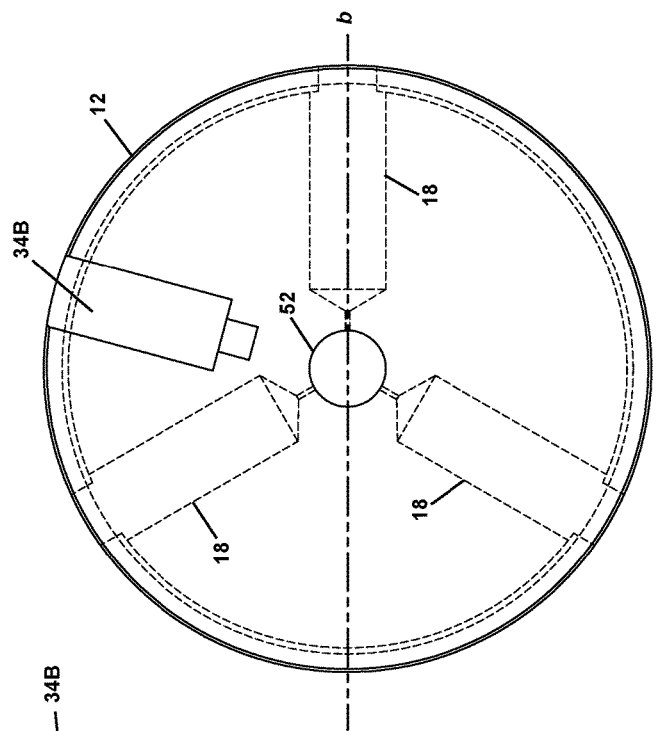
FIG. 5C is a bottom perspective view, showing details of an upper air bushing 12 of precision pneumatic drill spindle 10 of FIGS. 1A-1C.
Figure 5B:
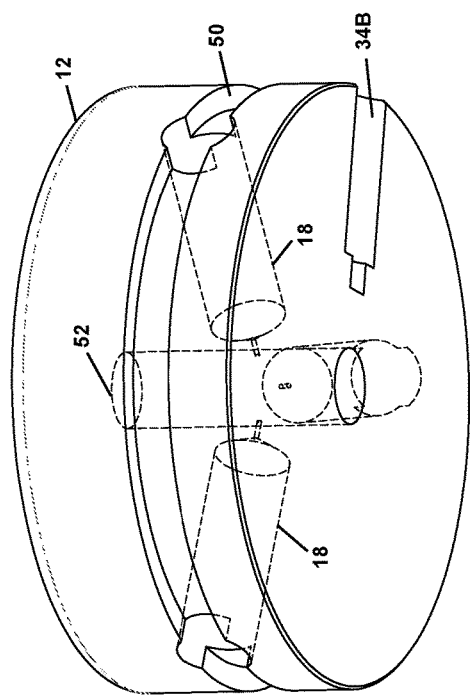
FIG. 5B is a bottom perspective view.

Referring now to FIGS. 5A-5C, details of upper air bushing 12 are shown, in a cross-section perspective view, bottom perspective view and a bottom view, respectively. A hole 52 through the body of upper air bushing 12 provides an outer surface of an air bearing formed between shank 2 and the body of upper air bushing 12 when pressurized air is supplied through the tips of nozzles 18. Inlets of nozzles 18 are fed pressurized air from a channel 50 that provide a manifold in fluid communication with channel 15B of FIG. 1A. A recess 34B accommodates an upper portion of optical reflection sensor 17 of FIG. 1A so that optical reflection sensor 17 extends through upper air bushing 12 to reach thrust washer 19 as shown in FIG. 1A. As shown in FIG. 5C, nozzles 18 are arranged symmetrically around hole 52 so that shank 2 is supported by the supplied air stream during operation. A cutting plane b of the cross-section illustrated in FIG. 5A is shown in FIG. 5C.

Referring now to FIGS. 6A-6D, details of lower air bushing 14 are shown, in a top view, a cross-section perspective view, a top perspective view and a side view, respectively. A cutting plane c of the cross-section illustrated in FIG. 6B is shown in FIG. 6A. As in upper air bushing 12 of FIGS. 5A-5C, lower air bushing 14 incorporates a channel 50A that serves as a manifold to distribute pressurized air to a plurality of nozzles 18A formed in the body of lower air bushing 14 and disposed symmetrically around a hole 62 that provides an outer surface of an air bearing formed between shank 2 and the body of lower air bushing 14 when pressurized air is supplied through the tips of nozzles 18A. Channel 50A is in fluid communication with channel 15B to receive the source of pressurized air from channel 15A and inlet 8A. Lower air bushing 14 also incorporates ports 64 as mentioned above with reference to FIG. 1A that are inclined with respect to hole 62, and thus shank 2, to direct air exiting chamber 32 downward to drill bit tip 1 (not shown) for cooling and removal of debris. A plurality of ramps 66 are disposed around hole 62 to receive pressurized air from chamber 32 and to direct the air to exit through ports 64.

Figure 7:
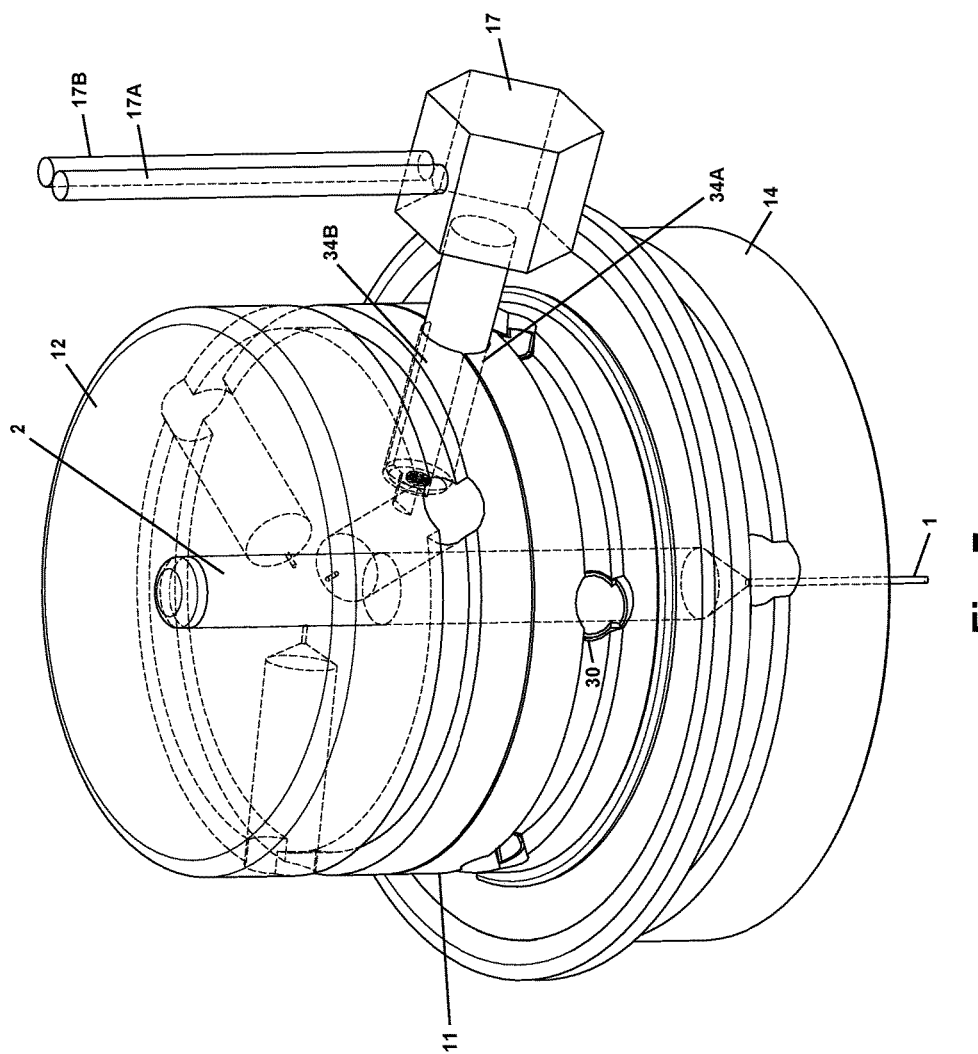
FIG. 7 and FIG. 8 are perspective views illustrating assembly of precision pneumatic drill spindle 10 of FIGS. 1A-1C.
Figure 8:
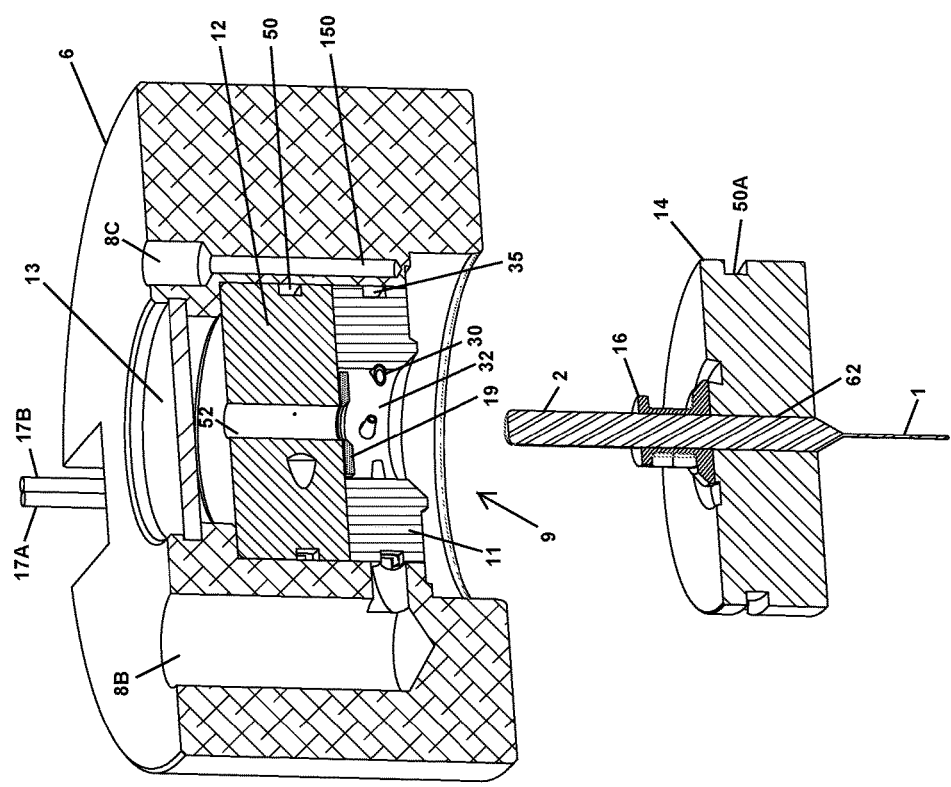

Referring now to FIG. 7 and FIG. 8, further details of the assembly of internal components of precision pneumatic drill spindle 10 are shown in a perspective view. Upper air bushing 12 is inserted in the bottom void 9 of housing 6 and optical reflection sensor 17 is inserted to lie in recess 34B. Nozzle assembly 11 is then inserted to contact the lower surface of upper air bushing 12 after thrust washer 19 is installed. Thrust washer 19 will rest on the tips of nozzles 30 of nozzle assembly 11 until shank 2 is installed in precision pneumatic drill spindle 10. Collar 16 is installed atop lower air bushing 14 by inserting shank 2 through hole 62 provided through lower air bushing 14 and collar 16 is press-fit to shank 2. Finally the assembly of shank 2, collar 16 and lower air bushing 14 is installed by inserting collar 16 into chamber 32, so that shank 2 passes through thrust washer 19 and through hole 52 of upper air bushing 12. Lower air bushing 14 is retained in position within bottom void 9 by applying vacuum to port 8C, which is in fluid communication with the top of lower air bushing 14 via a channel 15D, and the vacuum can be controlled to pick up and release multiple assemblies including the drill bit comprised of shank 2 and drill bit tip 1, collar 16 and lower air bushing 14 as shown, for replacing broken bits, changing drill sizes, or for attaching alternate tooling.

While the invention has been particularly shown and described with reference to the preferred embodiment thereof, it will be understood by those skilled in the art that the foregoing and other changes in form, and details may be made therein without departing from the spirit and scope of the invention.

What is claimed is:
1. A precision pneumatic drill spindle, comprising:
a housing;
an inlet disposed on an exterior surface of the housing for receiving a source of pressurized gas;
a collar within a chamber inside the housing, the collar having a plurality of turbine blades formed therein and having a hole formed therethrough for accepting a shank of a drill bit, wherein the collar includes a ring portion, and wherein the plurality of turbine blades are concave cavities formed in the ring portion thereof and that have a tapering depth extending around a circumference of the ring portion;
a plurality of nozzles within the housing and in fluid communication with the inlet to receive the pressurized gas and for constricting the flow of the pressurized gas to a corresponding plurality of outlets directed at the turbine blades of the collar to cause rotation of the collar, wherein the plurality of nozzles are arranged around the circumference of the ring portion to direct the pressurized gas at the concave cavities as the collar rotates with respect to the plurality of nozzles, wherein the concave cavities form dual symmetric concave shapes about a plane parallel to the circumference of the ring portion, and wherein the dual symmetric concave shapes define an edge at their intersection with the plane, whereby the pressurized gas directed from the nozzles is divided as the gas is directed into the dual symmetric concave shapes;
a first air bushing within the housing for supporting an upper end of the shank opposite a tip of the drill bit; and
a second air bushing at a lower end of the housing for supporting a lower portion of the shank below the collar.

2. The precision pneumatic drill spindle of claim 1, wherein the second air bushing further includes inclined channels that vent gas downward and outside of the precision pneumatic drill spindle to direct gas exiting the chamber toward the tip of the drill bit for removal of drilling debris and cooling of the tip of the drill bit.

3. The precision pneumatic drill spindle of claim 1, wherein the collar further includes a conical bottom portion that expands in circumference from the circumference of the ring portion to a larger circumference providing a surface that is suspended over a top surface of the second air bushing during operation, and further comprising a thrust washer atop the collar having a first area matching a second area of the bottom of the conical bottom portion of the collar and that is suspended below a bottom surface of the first air bushing during operation.

4. The precision pneumatic drill spindle of claim 3, further comprising an optical reflection sensor within the housing and having a detection beam directed at the thrust washer, wherein the thrust washer includes a high contrast feature along an edge thereof, whereby the optical reflection sensor detects rotation of the collar.

5. The precision pneumatic drill spindle of claim 1, wherein the inlet is a first inlet and further comprising a second inlet for receiving another source of pressurized gas, wherein the second inlet is in fluid communication with a plurality of channels for directing pressurized gas from the second inlet to the first air bushing and the second air bushing.

6. The precision pneumatic drill spindle of claim 5, wherein the plurality of nozzles is a first plurality of nozzles, and wherein the first air bushing includes a second plurality of nozzles for constricting a first flow of the pressurized gas received from the second inlet and directing the first flow of the pressurized gas at the shank of the drill bit, and wherein the second air bushing includes a third plurality of nozzles for constricting a second flow of the pressurized gas received from the second inlet and directing the second flow of the pressurized gas at the shank of the drill bit.

7. The precision pneumatic drill spindle of claim 1, wherein the housing defines a cylindrical void at a bottom side thereof, wherein the first air bushing and the second air bushing are substantially cylindrical bushings configured to fit into the cylindrical void at the bottom side of the housing.

8. The precision pneumatic drill spindle of claim 7, further comprising a substantially cylindrical nozzle assembly body configured to fit into the cylindrical void at the bottom side of the housing and between the first air bushing and the second air bushing, wherein the nozzle assembly body has a central void providing the chamber in which the collar is located, wherein the nozzle assembly body defines conical holes extending from an outer circumference of the nozzle assembly body to the central body, wherein the plurality of nozzles are nozzle inserts inserted through the conical holes of the nozzle assembly body, and wherein tips of the nozzle inserts are located within the central void of the nozzle assembly body.

9. A precision pneumatic drill spindle, comprising:
   a housing having a cylindrical void at a bottom side thereof;
   a first inlet disposed on an exterior surface of the housing for receiving a first source of pressurized gas;
   a collar disposed within a chamber inside the housing, the collar having a hole formed therethrough for accepting a shank of a drill bit, the collar having a ring portion with a plurality of concave cavities that have a tapering depth extending around a circumference of the ring portion;
   a substantially cylindrical nozzle assembly body configured to fit into the cylindrical void at the bottom side of the housing and between the first air bushing and the second air bushing, wherein the nozzle assembly body has a central void forming the chamber in which the collar is located, and wherein the nozzle assembly body defines conical holes extending from an outer circumference of the nozzle assembly body to the central body, wherein the plurality of nozzles are nozzle inserts inserted through the conical holes of the nozzle assembly body, wherein tips of the nozzle inserts are located within the chamber, wherein the nozzle inserts are in fluid communication with the inlet to receive the pressurized gas from the first source and for constricting the flow of the pressurized gas to a corresponding plurality of outlets directed at a plurality of turbine blades of the collar to cause rotation of the collar;
   a second inlet disposed on an exterior surface of the housing for receiving a second source of pressurized gas;
   a substantially cylindrical first air bushing within the cylindrical void of the housing and at an upper end thereof, for supporting an upper end of the shank opposite a tip of the drill bit, wherein the first air bushing includes a second plurality of nozzles in fluid communication with the second inlet for receiving pressurized gas from the second inlet and directing the pressurized gas received from the second inlet toward the shank; and
   a substantially cylindrical second air bushing within the cylindrical void of the housing at a lower end thereof for supporting a lower portion of the shank below the collar, wherein the second air bushing includes a third plurality of nozzles in fluid communication with the second inlet for receiving pressurized gas from the second inlet and directing the pressurized gas received from the second inlet toward the shank, wherein the second air bushing further includes inclined channels that vent gas downward from the central void of the nozzle assembly to direct the exiting gas toward the tip of the drill bit for removal of drilling debris and cooling of the tip of the drill bit.

10. The precision pneumatic drill spindle of claim 9, wherein the concave cavities form dual symmetric concave shapes about a plane parallel to the circumference of the ring portion, and wherein the dual symmetric concave shapes define an edge at their intersection with the plane, whereby the pressurized gas directed from the nozzles is divided as the gas is directed into the dual symmetric concave shapes.

11. A method of drilling a microelectronic substrate, the method comprising:
   providing a source of pressurized gas to an inlet provided on a housing of a drill spindle;
   rotating a drill bit by directing the pressurized gas at a collar within the housing having a plurality of turbine blades formed therein and having a hole formed therethrough for accepting a shank of the drill bit from a plurality of nozzles within the housing and in fluid communication with the inlet to receive the pressurized gas so that the nozzles constrict the flow of the pressurized gas to a corresponding plurality of outlets directed at the turbine blades of the collar to cause rotation of the collar, wherein the collar includes a ring portion, wherein the plurality of turbine blades are concave cavities formed in the ring portion thereof and that have a tapering depth extending around a circumference of the ring portion, wherein the plurality of nozzles are arranged around the circumference of the ring portion to direct the pressurized gas at the concave cavities as the collar rotates with respect to the plurality of nozzles, wherein the concave cavities form dual symmetric concave shapes about a plane parallel to the circumference of the ring portion, and wherein the dual symmetric concave shapes define an edge at their intersection with the plane, whereby the pressurized gas directed from the nozzles is divided as the gas is directed into the dual symmetric concave shapes;
   supporting an upper end of the shank of the drill bit opposite a tip of the drill bit with a first air bushing within the housing; and
   supporting a lower portion of the shank below the collar with a second air bushing at a lower end of the housing.

12. The method of claim 11, wherein the second air bushing further includes inclined channels that vent gas exiting the chamber downward and outside of the precision pneumatic drill spindle to direct the exiting gas toward the tip of the drill bit for removal of drilling debris and cooling of the tip of the drill bit.

13. The method of claim 11, wherein the collar further includes a conical bottom portion that expands in circumference from the circumference of the ring portion to a larger circumference providing a surface that is suspended over a top surface of the second air bushing during operation, and further comprising providing a thrust washer atop the collar having a first area matching a second area of the bottom of the conical bottom portion of the collar and that is suspended below a bottom surface of the first air bushing during operation.

14. The method of claim 13, further comprising detecting rotation of the thrust washer with an optical reflection sensor within the housing and having a detection beam directed at the thrust washer, wherein the thrust washer includes a high contrast feature along an edge thereof.

15. The method of claim 11, wherein the inlet is a first inlet and further comprising providing a second source of pressurized gas at a second inlet disposed on the housing, and directing pressurized gas from the second inlet to the first air bushing and the second air bushing through a plurality of channels.

16. The method of claim 11, further comprising supporting the plurality of nozzles with a nozzle assembly body having a central void that supplies the chamber, wherein the nozzle assembly body defines conical holes extending from an outer circumference of the nozzle assembly body to the central body, wherein the plurality of nozzles are nozzle inserts inserted through the conical holes of the nozzle assembly body, and wherein tips of the nozzle inserts are located within the central void of the nozzle assembly body.

17. A precision pneumatic drill spindle, comprising:
   a housing;
   a first inlet disposed on an exterior surface of the housing for receiving a source of pressurized gas;
   a second inlet for receiving another source of pressurized gas;
   a collar within a chamber inside the housing, the collar having a plurality of turbine blades formed therein and having a hole formed therethrough for accepting a shank of a drill bit;
   a plurality of nozzles within the housing and in fluid communication with the inlet to receive the pressurized gas from the first inlet and for constricting the flow of the pressurized gas to a corresponding plurality of outlets directed at the turbine blades of the collar to cause rotation of the collar;
   a first air bushing within the housing for supporting an upper end of the shank opposite a tip of the drill bit;
   a second air bushing at a lower end of the housing for supporting a lower portion of the shank below the collar; and
   a plurality of channels for directing the pressurized gas from the second inlet to the first air bushing and the second air bushing.

18. A method of drilling a microelectronic substrate, the method comprising:
   providing a first source of pressurized gas to a first inlet provided on a housing of a drill spindle;
   providing a second source of pressurized gas at a second inlet disposed on the housing;
   rotating a drill bit by directing the pressurized gas from the first inlet at a collar within the housing having a plurality of turbine blades formed therein and having a hole formed therethrough for accepting a shank of the drill bit from a plurality of nozzles within the housing and in fluid communication with the inlet to receive the pressurized gas so that the nozzles constrict the flow of the pressurized gas from the first inlet to a corresponding plurality of outlets directed at the turbine blades of the collar to cause rotation of the collar;
   supporting an upper end of the shank of the drill bit opposite a tip of the drill bit with a first air bushing within the housing;
   supporting a lower portion of the shank below the collar with a second air bushing at a lower end of the housing; and
   directing the pressurized gas from the second inlet to the first air bushing and the second air bushing through a plurality of channels.

* * * * *